US008773113B2

(12) United States Patent  
Le Goff et al.

(10) Patent No.: US 8,773,113 B2  
(45) Date of Patent: Jul. 8, 2014

(54) MEASUREMENT OF A CYCLIC MOTION OF A FERROMAGNETIC PART

(75) Inventors: Alexis Le Goff, Versailles (FR); Roland Blanpain, Entre-Deux-Guiers (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 364 days.

(21) Appl. No.: 13/008,609

(22) Filed: Jan. 18, 2011

(65) Prior Publication Data

US 2011/0215796 A1    Sep. 8, 2011

(30) Foreign Application Priority Data

Jan. 21, 2010  (FR) ...................................... 10 50399

(51) Int. Cl.  
  *G01B 7/14*    (2006.01)  
  *G01B 7/30*    (2006.01)  
  *G01R 33/00*   (2006.01)  
(52) U.S. Cl.  
  CPC  *G01R 33/00* (2013.01); *G01B 7/30* (2013.01); *G01B 7/14* (2013.01)  
  USPC .................. 324/207.11; 324/244; 324/207.23; 324/207.21; 324/207.22; 324/207.25; 324/207.13; 324/207.15; 324/260; 324/262; 324/117 R; 324/228
(58) Field of Classification Search  
  CPC ............. G01B 7/14; G01B 7/30; G01R 33/00  
  USPC .................. 324/244, 207.23, 207.21–207.22, 324/207.25, 207.11, 207.13, 207.15, 260, 324/262, 117 R, 228; 73/504.07  
  See application file for complete search history.

(56) References Cited

U.S. PATENT DOCUMENTS

| 4,669,046 | A | * | 5/1987 | Kubo .............................. 701/76 |
| 5,029,118 | A | * | 7/1991 | Nakajima et al. ............. 702/195 |
| 5,293,578 | A | * | 3/1994 | Nagami et al. ............. 381/71.14 |
| 5,311,446 | A | * | 5/1994 | Ross et al. ..................... 700/280 |
| 5,311,453 | A | * | 5/1994 | Denenberg et al. ........... 700/280 |
| 5,419,198 | A | * | 5/1995 | Pla ................................. 73/660 |
| 5,530,764 | A | * | 6/1996 | Uchida et al. .............. 381/71.14 |

(Continued)

FOREIGN PATENT DOCUMENTS

| EP | 0828161 | A2 |   | 3/1998 |
| EP | 1146319 | A2 |   | 10/2001 |
| EP | 1541971 | A2 |   | 6/2006 |
| EP | 2110523 |    | * | 4/2008 |

OTHER PUBLICATIONS

Hernandez, "Improving the Response of Wheel Speed Sensors by Using Robust and Optimal Signal Processing Techniques", IEEE ISIE 2005, Jun. 20-23, 2005, p. 1049-1054.*

(Continued)

*Primary Examiner* — Patrick Assouad  
*Assistant Examiner* — Lamarr Brown  
(74) *Attorney, Agent, or Firm* — Vedder Price PC

(57) ABSTRACT

Cyclic motion of a ferromagnetic part in an environment made noisy by at least one electric source with an A.C. component is measured using at least one first magnetometer sensitive to the moving part and a sensor of an image of current in the electric source. An estimate is calculated of noise linked to the electric source on a signal measured by the first magnetometer and then subtracted from the measured signal.

9 Claims, 3 Drawing Sheets

(56) References Cited

U.S. PATENT DOCUMENTS

| | | | |
|---|---|---|---|
| 5,638,305 A * | 6/1997 | Kobayashi et al. | 700/280 |
| 5,638,454 A * | 6/1997 | Jones et al. | 381/71.14 |
| 5,692,052 A * | 11/1997 | Tanaka et al. | 381/71.9 |
| 6,474,278 B1 * | 11/2002 | Davis et al. | 123/90.15 |
| 6,665,607 B2 * | 12/2003 | Skala et al. | 701/114 |
| 6,810,366 B2 * | 10/2004 | Kendrick et al. | 702/190 |
| 6,828,781 B1 * | 12/2004 | Butzmann | 324/207.19 |
| 7,035,796 B1 * | 4/2006 | Zhang et al. | 704/226 |
| 7,050,516 B2 * | 5/2006 | Currivan et al. | 375/346 |
| 7,088,829 B1 * | 8/2006 | Schick et al. | 381/71.4 |
| 7,130,433 B1 * | 10/2006 | Suzuki | 381/94.8 |
| 7,203,321 B1 * | 4/2007 | Freymann et al. | 381/61 |
| 7,208,944 B2 * | 4/2007 | Tatschl et al. | 324/207.25 |
| 7,706,547 B2 * | 4/2010 | Luo et al. | 381/71.8 |
| 7,725,248 B2 * | 5/2010 | Hagel et al. | 701/115 |
| 2006/0025906 A1 * | 2/2006 | Syed et al. | 701/22 |
| 2006/0071659 A1 * | 4/2006 | Tatschl et al. | 324/207.25 |
| 2009/0128166 A1 * | 5/2009 | Webster | 324/662 |
| 2010/0014685 A1 * | 1/2010 | Wurm | 381/71.11 |
| 2010/0057325 A1 * | 3/2010 | Livshiz et al. | 701/102 |
| 2010/0088010 A1 * | 4/2010 | Verdejo et al. | 701/105 |
| 2010/0188100 A1 * | 7/2010 | Andarawis et al. | 324/601 |
| 2011/0295538 A1 * | 12/2011 | Andarawis et al. | 702/94 |

OTHER PUBLICATIONS

Hernabdez, "Improving the Response of a Wheel Speed Sensor by Using Frequency-Domain Adaptive Filtering", IEEE Sensors Journal, vol. 3, No. 4, Aug. 2003, p. 404-413.*

"Search Report" from French Patent Application FR 10/50399 dated Sep. 16, 2010.

* cited by examiner

MEASUREMENT OF A CYCLIC MOTION OF A FERROMAGNETIC PART

BACKGROUND OF THE INVENTION

1. Field of the Invention

The present invention generally relates to measurement systems using the magnetic field generated by a ferromagnetic part to estimate magnitudes (speed, position, etc.) associated with a cyclic motion of this part. The present invention more specifically relates to measurements linked to a rotating motion of a ferromagnetic part.

2. Discussion of Prior Art

The use of magnetic field measurements to determine the rotation speed of an automobile vehicle wheel is known. For example, document EP-A-0828161 describes a detection method and device in which a magnetic sensor is placed close to the wheel to use a ferromagnetic signature thereof and to deduce its rotation speed therefrom. To decrease the influence of other magnetic sources close to the wheel (the chassis, the door, etc.), it is provided to perform a differential measurement of signals originating from several sensors placed close to the wheel. The field components originating from magnetic sources of fixed value placed nearby are thus eliminated.

It would be desirable to be able to extract information relative to the rotation of a ferromagnetic part (for example, the crankshaft, the camshaft, etc.) of an automobile vehicle motor by measurement of the magnetic field.

The angular position of the crankshaft or of the camshaft is currently determined by an optical encoder. Such an encoder must then be isolated from soils which would distort the measurements. This generates a complex implementation.

However, transposing magnetic systems known for wheels to the estimation of the motion of other vehicle elements, and especially to the analysis of the motion of rotating elements of the motor, is an issue, since variable magnetic fields, of non-negligible amplitude as compared with the magnetic field of the parts for which a rotation measurement is desired to be performed, disrupt the measurement.

SUMMARY OF THE INVENTION

An object of the present invention is to provide a method and a system for extracting information relative to the rotation of a ferromagnetic part from a measurement of the magnetic field emitted by this part, in an environment made noisy by other variable sources.

More generally, an object of an embodiment of the present invention is the analysis of a cyclic motion of a ferromagnetic part in an environment made noisy by one or several variable sources.

To achieve all or part of these and other objects, the present invention provides a system for measuring a cyclic motion of a ferromagnetic part in an environment made noisy by at least one electric source with an A.C. component, comprising:
  at least one first magnetometer sensitive to the moving part;
  a sensor of an image of the current in said electric source;
  means for calculating an estimate of the noise due to the electric source on a signal measured by the first magnetometer; and means for subtracting said estimate from the measured signal.

According to an embodiment of the present invention, said image of the current in said A.C. source is the voltage thereacross.

According to an embodiment of the present invention, said calculation means comprise at least one Wiener filter.

According to an embodiment of the present invention, said magnetometer is placed closer to said part than to any other moving ferromagnetic part.

According to an embodiment of the present invention, the system comprises:
  at least one second magnetometer placed close to a second moving ferromagnetic part;
  means for calculating an estimate of the noise due to this second part on the signal measured by the first magnetometer; and
  means for subtracting this estimate from the measured signal.

According to an embodiment of the present invention, said source with an A.C. component is an alternator associated with a vehicle motor.

According to an embodiment of the present invention, said source with an A.C. component is the A.C. current of an electric motor.

The present invention also provides a method for estimating a cyclic motion of at least one ferromagnetic part in an environment made noisy by at least one electric source with an A.C. component, comprising the steps of
  measuring an image of the magnetic field influenced at least by said part;
  measuring an image of the current in said electric source;
  applying a correlation filtering to said image of the magnetic field to eliminate the influence of said electric source.

According to an embodiment of the present invention, a noise component originating from another ferromagnetic part is eliminated by correlation filtering by using at least one second magnetometer associated with this second part.

The foregoing and other objects, features, and advantages of the present invention will be discussed in detail in the following non-limiting description of specific embodiments in connection with the accompanying drawings.

DETAILED DESCRIPTION

Figure 1:
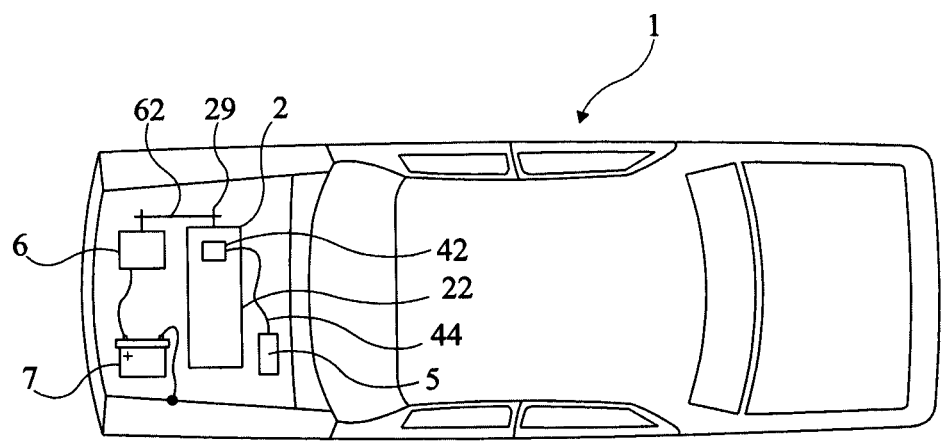
FIG. 1 is a simplified view of an automobile vehicle equipped with a system for measuring the motion of a rotating element of a motor according to an embodiment of the present invention.

The same elements have been designated with the same reference numerals in the different drawings. For clarity, only those elements and steps which are useful to the understanding of the present invention have been shown and will be described. In particular, the practical forming of a magnetometer capable of providing information along one or several axes has not been detailed, the present invention being compatible with usual magnetometers. Further, the utilisation of the information relative to the analyzed cyclic motion has not been detailed either, the present invention being here again compatible with the usual use of speed, position, etc. measurements of a part following a cyclic motion.

FIG. 1 is a simplified top view of an automobile vehicle 1 equipped with a system for analyzing the rotating motion of a ferromagnetic part of the motor according to an embodiment of the present invention.

In this example, the rotating speed of a camshaft (not shown in FIG. 1) of motor 2 of the vehicle is desired to be estimated.

Figure 2:
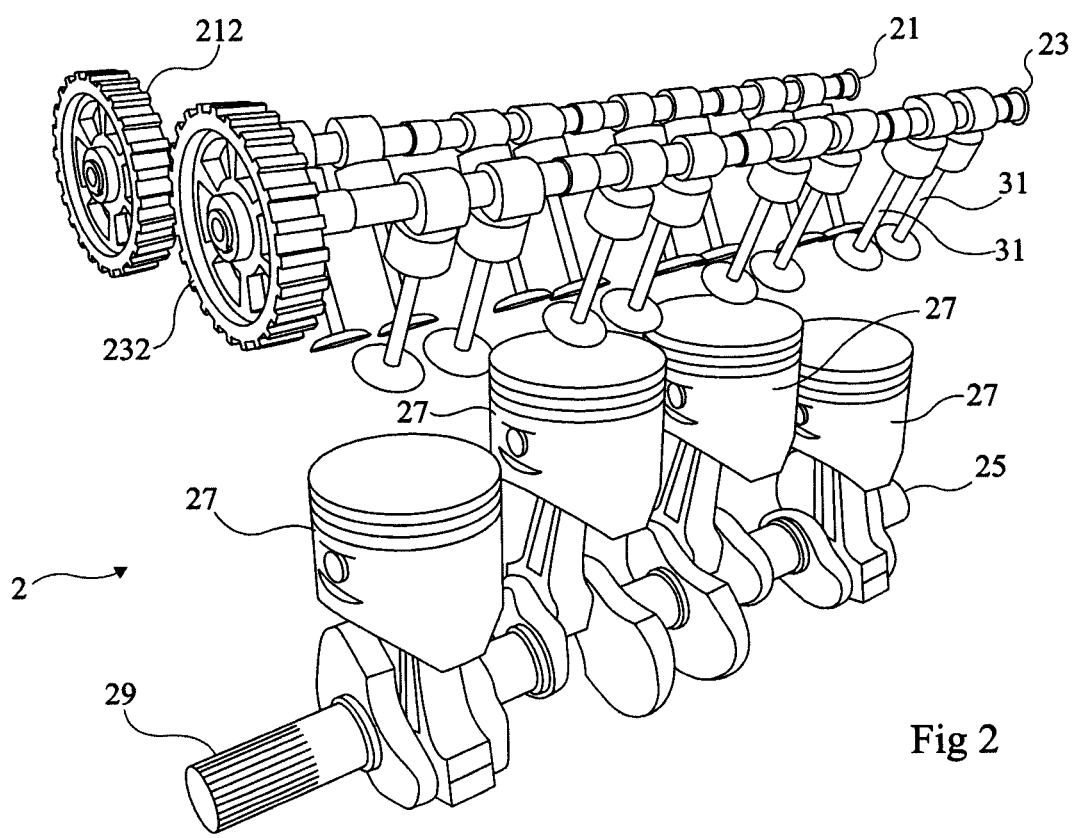
FIG. 2 is a partial simplified perspective view of mobile elements of an example of automobile vehicle.

FIG. 2 is a partial perspective view showing rotating elements contained in an automobile vehicle motor 2. In the example of FIG. 2, the motor has a double over head camshaft 21 and 23. A crankshaft 25 of the motor, pistons 27, a drive shaft 29 at the end of the crankshaft, and intake and outlet valves 31 associated with each cylinder are also shown in FIG. 2. These elements belong to the motor elements having cyclic motions which may be analyzed according to other embodiments. Drive shaft 29 drives a timing belt, not shown, which meshes in, among others, with toothed wheels 212 and 232 associated with camshafts 21 and 23. Another belt (62, FIG. 1) driven by drive shaft 29 is used to drive an alternator 6 intended to recharge a battery 7.

In the embodiment of FIG. 1, a magnetic sensor 42 is placed on frame 22 of motor 2, close to the camshaft, and the signals that it recovers are sent over a wire connection 44 to an interpretation and analysis circuit 5.

The present inventor has found out that the main source of noise on measurements by a magnetometer placed closed to a rotating ferromagnetic element of the motor originates from the alternator, and more specifically from the fact that it forms an electric source with an A.C. component.

Further, this A.C. component may be determined from a measurement of the voltage across the alternator, without it being necessary to use an additional magnetic sensor for a differential measurement.

According to an embodiment of the present invention, it is thus provided to capture the image of the current of the alternator from a measurement of the voltage thereacross using a sensor 9 and to eliminate the noise generated by the alternator on the signals generated by magnetometer 42.

Typically, by placing a magnetometer against the motor frame, as close as possible to the camshaft, a field having an amplitude on the order of one microtesla is sensed. The disturbance due to the alternator on this magnetometer is of the same order of magnitude and thus cannot be neglected.

Eliminating the noise due to the alternator may be sufficient to obtain usable signals. In particular, if the magnetometer is placed close enough to the camshaft (in the example of FIG. 2, on top of the motor), the noise originating from other rotating sources may be neglected and does not disturb the measurements.

In the opposite case, at least one second magnetometer is used to estimate the noise of one or several non-negligible noise sources. For example, if this noise originates from the crankshaft, a magnetometer is placed against the frame, as close as possible to the crankshaft (in the example of FIG. 2, at the bottom of the motor). The signals originating from this second magnetometer are used to extract noise originating from the crankshaft, as will be seen hereafter in relation with FIG. 5.

Figure 3:
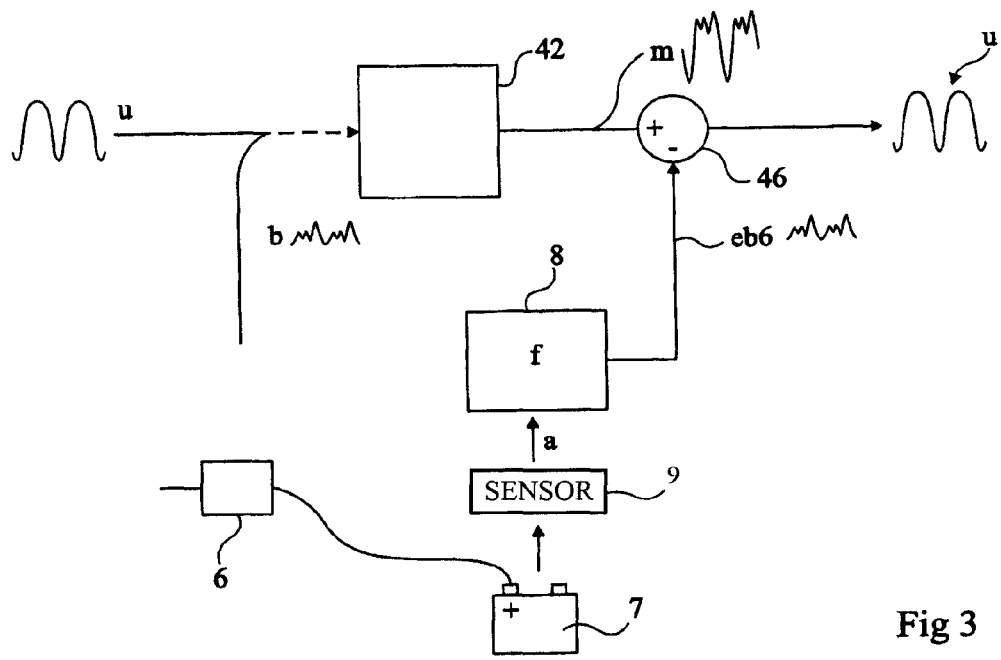
FIG. 3 is a block diagram illustrating an implementation mode of the present invention.

FIG. 3 is a block diagram illustrating an embodiment of the present invention according to which a signal m originating from magnetometer 42 is submitted to a filtering by a so-called correlation filtering technique to eliminate the noise due to alternator 6. The measured signal is considered to be disturbed by the magnetic field originating from the electric currents running from the alternator to the battery. Although the battery stores a D.C. voltage, the current originating from the alternator (or the voltage across the battery) has an A.C. component.

As illustrated in FIG. 3, it can be considered that the signal measured by magnetometer 42 corresponds to the addition of a useful signal u representing the magnetic field of the camshaft and of a noise signal b originating from the alternator.

Now, in addition to the observation of noisy signal m, information relative to noise b, independently from useful signal u (non-correlated with the useful signal) is available. This signal corresponds to voltage a across battery 7, which may be measured and which is not influenced by the magnetic field of the camshaft. It is then possible to determine a filter 8 (for example, a so-called Wiener filter) having a transfer function f which enables to obtain, from battery voltage a, an estimate eb6 of noise b. Estimate eb6 is then subtracted (subtractor 46) from measured signal m to restore useful signal u, which then only represents the magnetic field generated by the camshaft.

Transfer function f may be written as $f(v)=S_{ma}(v)/S_{aa}(v)$, where $S_{ma}(v)$ represents the cross-spectral power density between the observation of battery voltage a and noisy measurement m, and where $S_{aa}(v)$ represents the average power spectral density of signal a.

Correlation filtering techniques for eliminating the contribution of noise for which a so-called "noise alone" reference is available are known. Reference may for example be made to article "Application du corrélofiltre à l'élimination de raies en présence de bruit stationnaire" by D. BAUDOIS, A. SILVENT (Septième colloque sur le traitement du signal et ses applications, Nice, France, May 28 to Jun. 2, 1979).

Figure 4:
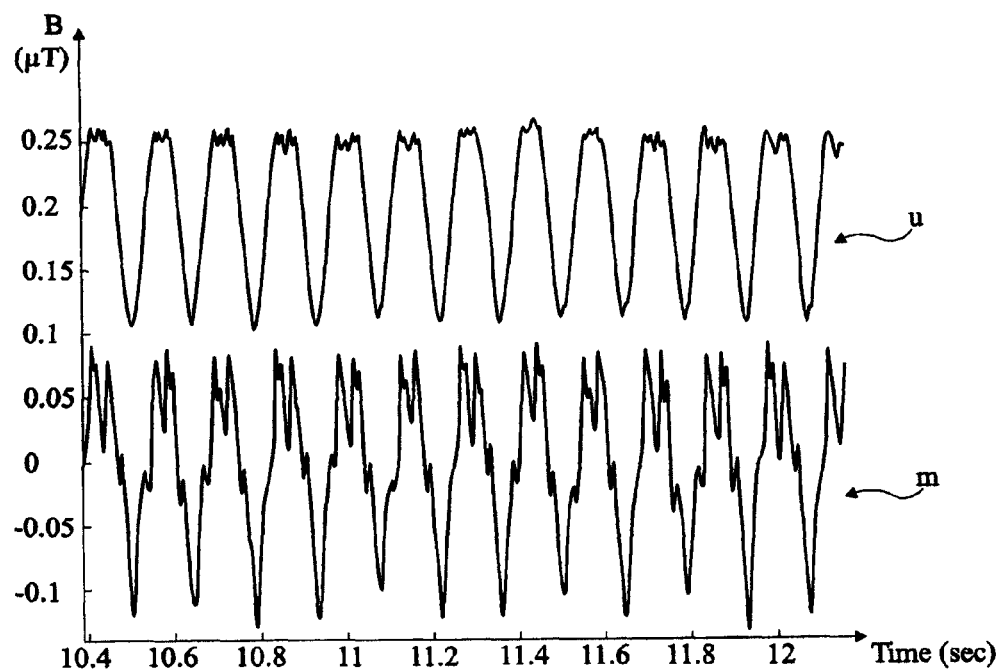
FIG. 4 illustrates in the form of timing diagrams an example of response obtained with the system of FIG. 3.

FIG. 4 illustrates the operation of the system for extracting the useful signal shown in FIG. 3. An example of useful signal u representing the magnetic field generated by the camshaft has been shown in the upper part of the drawing and noisy signal m measured by magnetometer 42 has been shown in the lower part. In the example of FIG. 3, a shifting of the reference level of the useful signal (which oscillates between approximately 0.1 µT and approximately 0.25 µT) with respect to the measured signal (which oscillates between approximately −0.1 µT and approximately 0.1 µT) is assumed.

The interpretation of useful signal u to deduce speed, angular position, acceleration, and other information only requires a signal processing based on time and position references. The position references may for example be obtained by a calibration on manufacturing. As a variation, a training procedure may be implemented.

If alternator 6 does not permanently rotate (which is for example the case for an electric vehicle), the noise due to the alternator is not taken into account during periods when it is not operating.

Figure 5:
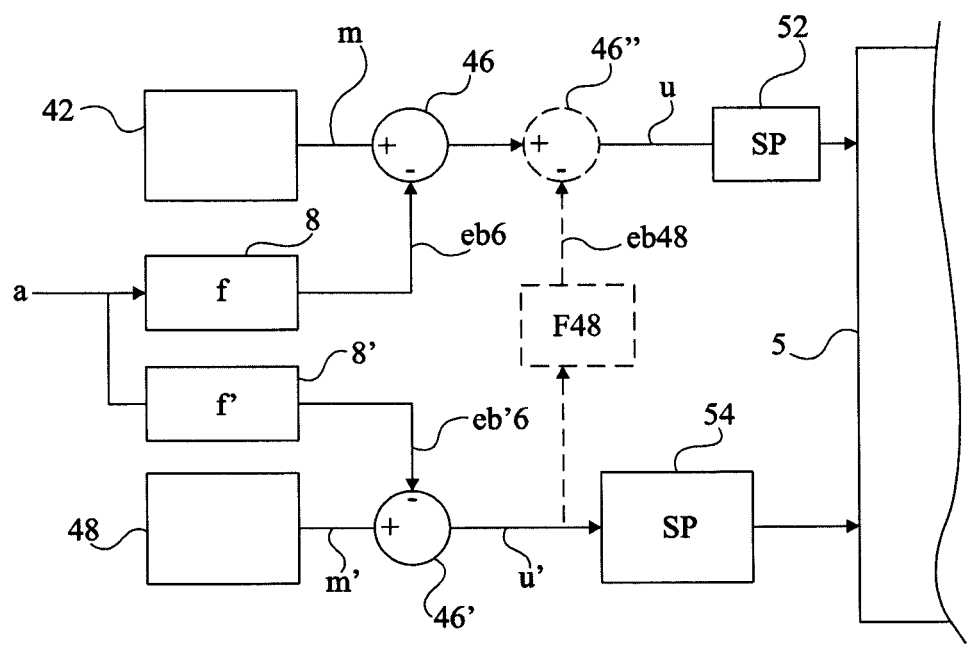
FIG. 5 is a block diagram of another embodiment of the present invention.

FIG. 5 is a block diagram of another embodiment illustrating the fact that several magnetic sensors 42 and 48 may be placed close to different rotating metal parts. For example, in addition to sensor 42 placed close to the camshaft, another sensor 48 is placed close to the crankshaft (25, FIG. 2) to measure its angular position or its speed. In the same way as for the camshaft, the main noise on measured signal m' originates from alternator 6. A filtering of measured signal m' must thus be performed to eliminate the estimated noise component eb'6 from the measurement of battery voltage a. Transfer function f' of filter 8' is different from that of filter 8 of the camshaft, since sensors 42 and 48 are not at the same distance from alternator 6 (and are further probably not in the same orientation). Useful signals u and u' provided by subtractors 46 and 46' are then used by signal processing circuits 52 and 54 (SP) so that the information relative to the motion of the camshaft and of the crankshaft are transmitted to electronic circuit 5, for example, the vehicle on-board computer.

In the case where signal u of the camshaft recovered after filtering of the noise due to the alternator remains tainted with too much noise due to another ferromagnetic source, it is possible to apply the same correlation filtering technique to eliminate this contribution. This functionality is illustrated in dotted lines in FIG. 5, where the crankshaft is considered to introduce non-negligible noise on the signal measured by magnetometer 42 associated with the camshaft. In this case, signal u' provided by subtractor 46' is considered to represent a noise-alone component due to the crankshaft and that it is then possible to estimate (signal eb48) its contribution to the signal originating from magnetometer 42 with a Wiener filter f48 calculated in the same way as discussed hereabove, and to subtract it (subtractor 46") from measured signal m.

Other sensors may further be associated with other elements.

An advantage of the present invention is that by arranging a magnetometer close to a rotating ferromagnetic part, information can be obtained in a simple way despite the non-negligible noise due to a source with an A.C. component.

It is now possible to analyze the motion of motor parts by magnetic field measurement, insensitive to the soiling necessarily present in the motor environment.

Another advantage is that the elimination of the alternator noise only requires a signal processing based on a measurement of the battery voltage. In particular, no magnetometer is required to eliminate the alternator noise.

Although the present invention has been described hereabove in relation with an application to an automobile motor vehicle, it more generally applies as soon as a ferromagnetic part is rotating and as said part is close to an electric source with an A.C. component. For example, in the case of a machine tool, it is possible to extract information relative to the position or to the speed of the motor shaft from a magnetic field captured by a magnetometer, even though said field is disturbed by the A.C. power supply current of the motor.

Various embodiments have been described. Various alterations, modifications, and improvements will occur to those skilled in the art. In particular, the selection of the respective positions of the magnetometer(s) close to the ferromagnetic elements depends on the configuration of the part from which information is desired to be extracted and on its environment. Preferably, the magnetometer(s) intended to measure the field of a given part are placed closer to this part than to any other moving ferromagnetic part.

Further, although the present invention has been described in relation with an example using a single magnetometer per ferromagnetic part, several magnetometers having different orientations or a multi-axis magnetometer may be used to extract additional information, similarly to the utilisation of multi-axis measurements in other applications. For example, the use of several sensors in different directions enables to implement a so-called independent component analysis source separation method. Reference may for example be made to article "Blind separation of sources, Part I: An adaptative algorithm based on neuromimetic architecture" by C. Jutten and J. Herault, published in Signal Processing 24 (1991) 1-10-Elsevier.

Further, the practical implementation of the present invention is within the abilities of those skilled in the art based on the functional indications given hereabove and on usual signal processing tools. In particular, the correlation filtering techniques provided as an example may be replaced with other similar signal processing techniques, provided to aspect the described functionalities. Further, the signal processing may be analog and/or digital.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A system for measuring a cyclic motion of at least one ferromagnetic part in an environment made noisy by at least one electric source with an A.C. component, comprising:
   a first magnetometer (42) sensitive to a first moving part and configured to provide a first measured signal (m);
   a second magnetometer (48) sensitive to a second moving part and configured to provide a second measured signal (m');
   a sensor of an image of the current in said electric source;
   a first filter (8) configured to calculate a first estimate, based on the image of the current in the electric source, of noise due to the electric source on the first measured signal;
   a second filter (8') configured to calculate a second estimate, based on the image of the current in the electric source, of noise due to the electric source on the second measured signal, the second filter having a transfer function different from the first filter;
   a first subtractor (46) configured to subtract the first estimate from the first measured signal to provide a first useful signal; and
   a second subtractor (46') configured to subtract the second estimate from the second measured signal to provide a second useful signal.

2. The system of claim 1, wherein said image of the current in said A.C. source is the voltage thereacross.

3. The system of claim 1, wherein the first filter and second filters each comprise at least one Wiener filter.

4. The system of claim 1 wherein said first and second magnetometers are placed closer to said first and second moving parts, respectively, than to any other moving ferromagnetic part.

5. The system of claim 1, comprising:
   a third filter (F48) configured to calculate a third estimate, based on the second useful signal, of noise due to the second moving part on the first useful signal; and
   a third subtractor (46") configured to subtract the third estimate from the first useful signal.

6. The system of claim 1, wherein said source with an A.C. component is an alternator associated with a motor of a vehicle.

7. The system of claim 1, wherein said source with an A.C. component is the A.C. current of an electric motor.

8. A method for estimating a cyclic motion of at least one ferromagnetic part in an environment made noisy by at least one electric source with an A.C. component, comprising the steps of:
   measuring a magnetic field influenced at least by a first ferromagnetic part to provide a first measured signal;
   measuring a magnetic field influenced at least by a second ferromagnetic part to provide a second measured signal;
   measuring an image of the current in said electric source;
   filtering the image of the current in said electric source to provide a first estimate of noise due to the electric source on the first measured signal;

filtering the image of the current in said electric source to provide a second estimate of noise due to the electric source on the second measured signal, wherein a second transfer function applied by the filtering to provide the second estimate is different from a first transfer function applied by the filtering to provide the first estimate;

subtracting the first estimate from the first measured signal to provide a first useful signal; and subtracting the second estimate from the second measured signal to provide a second useful signal.

9. The method of claim 8, further comprising:

filtering the second useful signal to provide a third estimate of noise due to the second ferromagnetic part on the first useful signal; and subtracting the third estimate from the first useful signal.

* * * * *